United States Patent [19]

Bruel

[11] Patent Number: 5,374,564
[45] Date of Patent: Dec. 20, 1994

[54] PROCESS FOR THE PRODUCTION OF THIN SEMICONDUCTOR MATERIAL FILMS

[75] Inventor: Michel Bruel, Veurey, France

[73] Assignee: Commissariat A l'Energie Atomique, France

[21] Appl. No.: 945,001

[22] Filed: Sep. 15, 1992

[30] Foreign Application Priority Data

Sep. 18, 1991 [FR] France ............................ 91 11491

[51] Int. Cl.$^5$ .......................................... H01L 21/265
[52] U.S. Cl. ............................... 437/24; 437/26; 437/966; 148/DIG. 12
[58] Field of Search ................ 437/24, 26, 966; 148/DIG. 12

[56] References Cited

U.S. PATENT DOCUMENTS

| | | | |
|---|---|---|---|
| 4,931,405 | 6/1990 | Kamijo et al. | 437/12 |
| 5,034,343 | 7/1991 | Rouse et al. | 437/86 |
| 5,198,371 | 3/1993 | Li | 437/11 |

FOREIGN PATENT DOCUMENTS

| | | |
|---|---|---|
| 53-104156 | 9/1978 | Japan . |
| 59-54217 | 3/1984 | Japan . |
| 2211991 | 7/1989 | United Kingdom . |

OTHER PUBLICATIONS

IBM Technical Disclosure Bulletin, vol. 29, No. 3, Aug., 1986, p. 1416.
Applied Physics Letter, vol. 55, No. 21, Nov. 20, 1989, pp. 2223–2224.

Primary Examiner—George Fourson
Assistant Examiner—D. Mason
Attorney, Agent, or Firm—Pearne, Gordon, McCoy & Granger

[57] ABSTRACT

Process for the preparation of thin moncrystalline or polycrystalline semiconductor material films, characterized in that it comprises subjecting a semiconductor material wafer having a planar face to the three following stages: a first stage of implantation by bombardment (2) of the face (4) of the said wafer (1) by means of ions creating in the volume of said wafer a layer (3) of gaseous microbubbles defining in the volume of said wafer a lower region (6) constituting the mass of the substrate and an upper region (5) constituting the thin film, a second stage of intimately contacting the planar face (4) of said wafer with a stiffener (7) constituted by at least one rigid material layer, a third stage of heat treating the assembly of said wafer (1) and said stiffener (7) at a temperature above that at which the ion bombardment (2) was carried out and sufficient to create by a crystalline rearrangement effect in said wafer (1) and a pressure effect in the said microbubbles, a separation between the thin film (5) and the mass of the substrate (6).

9 Claims, 1 Drawing Sheet

PROCESS FOR THE PRODUCTION OF THIN SEMICONDUCTOR MATERIAL FILMS

BACKGROUND OF THE INVENTION

The present invention relates to a process for the production of thin semiconductor material films, preferably applicable to the production of monocrystalline films.

It is known that for producing monocrystalline semiconductor films there are various methods and processes, which are often complex and expensive to carry out, because although it is relatively easy to produce polycrystalline or amorphous material films, it is much more difficult to produce monocrystalline films.

Among the methods used for producing monocrystalline films are those used for producing socalled "silicon on insulator" substrates, where the aim is to produce a monocrystalline silicon film resting on a substrate electrically insulated from the film.

By crystal growth heteroepitaxy methods make it possible to grow an e.g. thin film silicon crystal on a monocrystalline substrate of another type, whose lattice parameter is close to that of silicon, e.g. a sapphire substrate ($Al_2O_3$) or calcium fluoride substrate ($CaF_2$). (cf. ref. 5) (identified below).

The SIMOX process (name used in the literature) makes use of high oxygen dose ion implantation in a silicon substrate for creating in the silicon volume a silicon oxide layer separating a monocrystalline silicon film from the substrate mass (cf. ref. 1).

Other processes make use of the principle of thinning a wafer by chemical or mechanochemical abrasion. The most successful of the processes in this category also use the etch-stop principle, which makes it possible to stop the thinning of the wafer as soon as the requisite thickness is reached and in this way it is possible to ensure a uniformity of thickness. This procedure e.g. consists of p-type doping of the n-type substrate over the thickness of the film which it is wished to obtain and then chemically etching the substrate with a chemical bath active for the n-type silicon and inactive for the p-type silicon (cf. refs. 2 and 3).

The main applications of monocrystalline semiconductor films are silicon on insulator substrates, self-supporting silicon or silicon carbide membranes or diaphragms for producing X-ray lithography masks, sensors, solar cells and the production of integrated circuits with several active layers.

The various methods for producing thin monocrystalline films suffer from the disadvantages associated with the production procedures.

Heteroepitaxy methods are limited by the nature of the substrate, because the lattice parameter of the substrate is not precisely the same as that of the semiconductor, the film having numerous crystal defects. In addition, these substrates are expensive and fragile and only exist with limited dimensions.

The SIMOX method requires a very high dose ion implantation requiring a very heavy and complex implantation machine. The output of such machines is limited and it would be difficult to significantly increase it.

Thinning methods are not competitive from the uniformity and quality standpoints except when using the etch-stop principle. Unfortunately, the creation of said etch-stop makes the process complex and in certain cases can limit the use of the film. Thus, if the etch-stop is produced by p-type doping in a n-type substrate, any electronic devices produced in the film would have to adapt to the p-type nature of the film.

SUMMARY OF THE INVENTION

The present invention relates to a process for producing thin semiconductor material films making it possible to overcome the aforementioned disadvantages without requiring an initial substrate of a different nature from that of the chosen semiconductor, without requiring very high implantation doses, or an etch-stop, but which still makes it possible to obtain a film having a uniform, controlled thickness.

This process for the preparation of thin films is characterized in that it comprises subjecting a semiconductor material wafer having a planar face and whose plane is either substantially parallel to a principle crystallographic plane in the case where the semiconductor material is perfectly monocrystalline, or slightly inclined with respect to the principle crystallographic plane of the same indices for all the grains, in the case wherein the material is polycrystalline, to the three following stages:

a first stage of implantation by bombardment (2) of the face (4) of said wafer (1) by means of ions creating in the volume of said wafer at a depth close to the average penetration depth of the said ions, a layer (3) of gaseous microbubbles defining in the volume of said wafer a lower region (6) constituting the mass of the substrate and an upper region (5) constituting the thin film, the ions being chosen from among hydrogen gas or rare gas ions and the temperature of the wafer during implantation being kept below the temperature at which the gas produced by the implanted ions can escape from the semiconductor by diffusion, a second stage of intimately contacting the planar face (4) of said wafer with a stiffener (7) constituted by at least one rigid material layer, a third stage of thermally treating the assembly of said wafer (1) and said stiffener (7) at a temperature above that at which ion bombardment (2) takes place and adequate to create by a crystalline rearrangement effect in the wafer (1) and a pressure effect in the microbubbles, a separation between the thin film (5) and the mass of the substrate (6), the stiffener and the planar face of the wafer being kept in intimate contact during said stage.

Thus, the invention also applies to a polycrystalline semiconductor material, provided that the grains constituting the latter all have a principle crystallographic plane (said plane having the same indices, e.g. 1,0,0 for all the semiconductor grains) substantially parallel to the semiconductor surface. With respect to the semiconductor materials reference can be made to ZMRSOI (ZMR=Zone—Melting—Recrystallization) (cf. ref. 4). The term implantation stage is understood to mean both a single implantation stage and a succession of implantations at different doses and/or different energies and/or with different ions.

According to a variant of the process according to the invention, it can be advantageous to carry out ion implantation in a semiconductor material through one or more layers of materials, said "encapsulating" layers being chosen in such a way that the ions traverse the same and penetrate the semiconductor. For example, the encapsulating layers can be used as means for reducing the penetration of ions in the semiconductor for producing finer membranes or as a means for protecting the semiconductor from possible contamination, or as a means for controlling the physicochemical state of the semiconductor surface. When the substrate constituting the wafer is made from silicon, it can be advantageous to choose an encapsulating layer constituted by thermal silicon oxide with a thickness e.g. between 25 and 500 nm. These encapsulating layers can be retained or removed following the implantation stage.

According to the invention, the temperature of the wafer on which ion implantation takes place is controlled throughout the operation, so that it remains below the critical temperature at which the gas produced by the implanted ion diffuses rapidly and escapes from the semiconductor. For example, said critical temperature is approximately 500° C. for hydrogen implantation in silicon. Above said temperature, the process becomes ineffective due to the absence of microbubble formation. In the case of silicon, preference is given to an implantation temperature between 20° and 450° C.

During the third stage of the heat treatment of the wafer-stiffener assembly, there is a crystalline rearrangement following the disorder created by the ion implantation. The separation between the film and the substrate is due both to the crystalline rearrangement and to the coalescence of the bubbles, which produce macrobubbles, both resulting from the third stage heat treatment. Under the effect of the pressure of the gas within these bubbles, the semiconductor surface is subject to high stresses. If it is wished to avoid a surface deformation and the formation of blisters corresponding to the macrobubbles formed, it is vital to compensate these stresses. Thus, the blisters can shatter before the macrobubbles have reached their final growth stage and have coalesced with one another. Therefore if it is wished to obtain a continuous semiconductor film, it is necessary to compensate the stresses appearing during the heat treatment phase. According to the invention, this compensation is brought about by the intimate contacting of the semiconductor wafer surface and a stiffener. The function of the stiffener is that its contact with the surface and its mechanical properties will lead to a compensation of the stresses produced by the macrobubbles. Therefore the semiconductor film can remain flat and intact throughout the heat treatment phase and up to the final cleaving.

According to the invention, the choice of the production method for said stiffener and its nature are a function of each envisaged application for the said film. For example, if the intended application is the production of a silicon on insulator substrate, the stiffener can advantageously be constituted by a silicon wafer covered by at least one dielectric layer, such as an oxide or a nitride layer, the dielectric of the stiffener being intimately contacted with the wafer from which the film is to be produced, the wafer optionally having or not having an e.g. silicon oxide encapsulating layer.

The stiffener can either be joined to the wafer, or can be produced thereon with the aid of methods such as evaporation, atomization, chemical vapor deposition, which may or may not be plasma or photon-assisted, if the thickness chosen for the stiffener is of a moderate nature, i.e. a few micrometers to a few dozen micrometers.

The term intimate contact is understood to mean a contact obtained by pressing the stiffener onto the wafer, e.g. by electrostatic pressure and/or by an adherent contact.

Thus, according to the invention, said same stiffener can also be bonded to the semiconductor wafer either by an adhesive substance both to the stiffener and to the wafer, or, if it is not desired to use an adhesive substance, by the effect of a prior preparation of at least one of the surfaces to be bonded and a thermal and/or electrostatic treatment, optionally with a choice of pressures in order to assist the interatomic bonds between the stiffener and the semiconductor wafer. The stiffener can also be applied to the wafer by an electrostatic pressure.

For applications concerning the production of self-supporting diaphragms and membranes, it is appropriate to choose the nature of the stiffener such that it is easily and selectively possible to separate the stiffener from the film. For information purposes, in order to produce a monocrystalline silicon diaphragm, it is e.g. possible to choose a silicon oxide stiffener, which is then eliminated in a hydrofluoric acid bath following the third thermal stage of the process.

According to a feature of the process according to the invention, the choice of the performance temperatures for the second and third stages must comply with the following requirements. The installation of the stiffener on the wafer must not lead to the application thereto of a temperature, which might trigger the third stage procedures. For this reason, it is necessary according to the invention to carry out the second stage of the process at a temperature below that of the heat treatment of the third stage. This heat treatment must, according to the invention, be carried out at a temperature at which the crystalline rearrangement and coalescence of the bubbles can effectively take place. For example, in the case of silicon, a temperature above approximately 500° C. is necessary to enable the crystalline rearrangement and coalescence of the bubbles to take place with adequate kinetics.

In the performance of the process according to the invention, the ions used for implantation by bombardment are usually H+ ions, but this choice must not be looked upon as limitative. Thus, the principle of the method is applicable with molecular hydrogen ions or with ions of rare gases such as helium, neon, krypton and xenon, used either singly or in combination. For industrial applications of the process according to the invention, preference is given to group IV semiconductors and it is e.g. possible to use silicon, germanium, silicon carbide and silicon-germanium alloys.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

The embodiment which will now be described in conjunction with the above drawings relates to the production of a thin film in a monocrystalline silicon wafer with the aid of H+ ion implantations.

Figure 1:
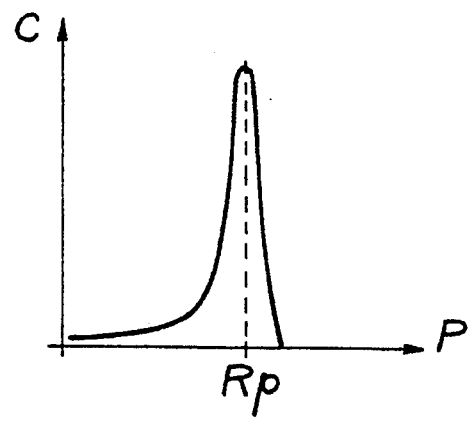
FIG. 1 The concentration profile of the hydrogen ions as a function of the penetration depth.

The implantation of H+ ions (protons) at 150 keV in a monocrystalline silicon wafer, whose surface corresponds to a principle crystallographic plane, e.g. a 1,0,0 plane leads, in the case of weak implantation doses ($<10^{16}$ cm$^{-2}$) to a hydrogen concentration profile C as a function of the depth P having a concentration maximum for a depth Rp, as shown in FIG. 1. In the case of a proton implantation in silicon, Rp is approximately 1.25 micrometers.

For doses of approximately $10^{16}$ cm$^{-2}$, the implanted hydrogen atoms start to form bubbles, which are distributed in the vicinity of a plane parallel to the surface. The plane of the surface corresponds to a principal crystallographic plane and the same applies with respect to the plane of the microbubbles, which is consequently a cleaving plane.

For an implanted dose of $>10^{16}$ cm$^{-2}$ (e.g. $5 \cdot 10^{16}$ cm$^2$), it is possible to thermally trigger the coalescence between the bubbles inducing a cleaving into two parts of the silicon, an upper 1.2 micrometer thick film (the thin film) and the mass of the substrate.

Hydrogen implantation is an advantageous example, because the braking process of said ion in silicon is essentially ionization (electronic braking), the braking of the nuclear type with atomic displacements only occurring at the end of the range. This is why very few defects are created in the surface layer of the silicon and the bubbles are concentrated in the vicinity of the depth Rp (depth of the concentration maximum) over a limited thickness. This makes it possible to obtain the necessary efficiency of the method for moderate implanted doses ($5 \cdot 10^{16}$ cm$^{-2}$) and, following the separation of the surface layer, a surface having a limited roughness.

The use of the process according to the invention makes it possible to choose the thickness of the thin film within a wide thickness range by choosing the implantation energy. This property is all the more important as the implanted ion has a low atomic number z. For example, the following table gives the thickness of the film which can be obtained for different implantation energies of H+ ions (z=1).

| Energy of H+ ions in keV | 10 | 50 | 100 | 150 | 200 | 500 | 1000 |
|---|---|---|---|---|---|---|---|
| Thickness of the film in μm | 0.1 | 0.5 | 0.9 | 1.2 | 1.6 | 4.7 | 13.5 |

Figure 2:
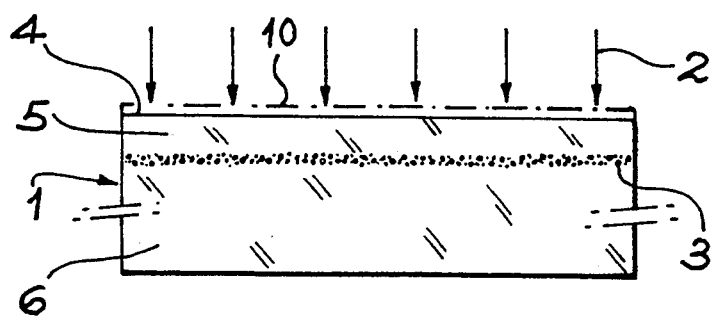
FIG. 2 The monocrystalline semiconductor wafer used in the invention as the origin of the monocrystalline film, in section, exposed to a bombardment of H+ ions and within which has appeared a gas microbubble layer produced by the implanted particles.

FIG. 2 shows the semiconductor wafer 1 optionally covered with an encapsulating layer 10 subject to an ion bombardment 2 of H+ ions through the planar face 4, which is parallel to a principal crystallographic plane. It is possible to see the microbubble layer 3 parallel to the face 4. The layer 3 and the face 4 define the thin film 5. The remainder of the semiconductor substrate 6 constitutes the mass of the substrate.

Figure 3:
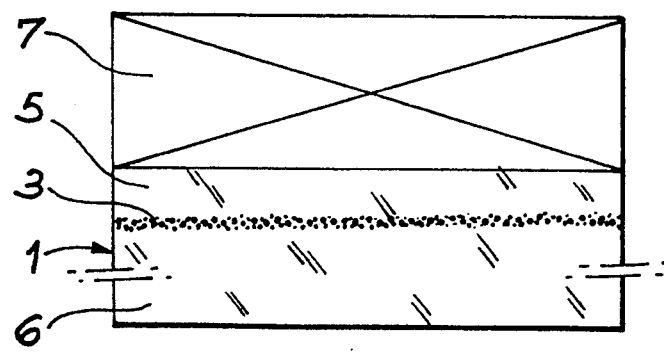
FIG. 3 The semiconductor wafer shown in FIG. 2 and covered with a stiffener.

FIG. 3 shows the stiffener 7 which is brought into intimate contact with the face 4 of the semiconductor wafer 1. In an interesting embodiment of the invention, ion implantation in the material takes place through a thermal silicon oxide encapsulating layer 10 and the stiffener 7 is constituted by a silicon wafer covered by at least one dielectric layer.

Another embodiment uses an electrostatic pressure for fixing the stiffener to the semiconductor material. In this case, a silicon stiffener is chosen having an e.g. 5000 Å thick silicon oxide layer. The planar face of the wafer is brought into contact with the oxide of the stiffener and between the wafer and the stiffener is applied a potential difference of several dozen volts. The pressures obtained are then a few $10^5$ to $10^6$ Pascal.

Figure 4:
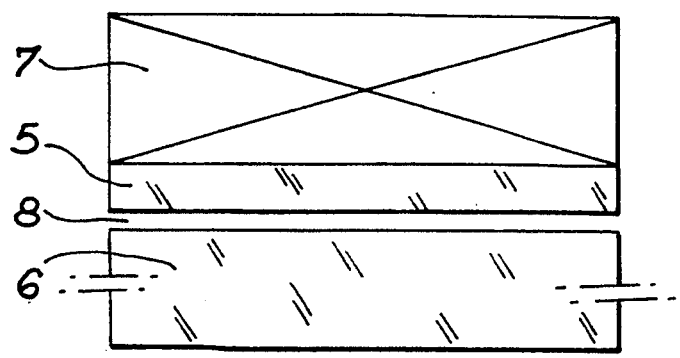
FIG. 4 The assembly of the semiconductor wafer and the stiffener shown in FIG. 3 at the end of the heat treatment phase, when cleaving has taken place between the film and the substrate mass.

FIG. 4 shows the film 5 joined to the stiffener 7 separated by the space 8 from the mass of the substrate 6.

The present text refers to the following documents:

(1) SIMOX SOI for Integrated Circuit Fabrication by Hon Wai Lam, IEEE Circuits and Devices Magazine, July 1987.

(2) Silicon on Insulator Wafer Bonding, Wafer Thinning, Technological Evaluations by Haisma, Spierings, Biermann et Pals, Japanese Journal of Applied Physics, vol. 28, no. 8, August 1989.

(3) Bonding of silicon wafers for silicon on insulator by Maszara, Goetz, Caviglia and McKitterick, Journal of Applied Physic 64 (10) 15 November 1988.

(4) Zone melting recrystallization silicon on insulator technology by Bor Yeu Tsaur, IEEE Circuits and Devices Magazine, July 1987.

(5) 1986 IEEE SOS/SOI Technology Workshop, Sep. 30–Oct. 2, 1986, South Seas plantation resort and yacht Harbour, Captiva Island, Fla.

I claim:

1. Process for the preparation of thin semiconductor material films, wherein the process comprises subjecting a semiconductor material wafer having a planar face and whose plane, is substantially parallel to a principal crystallographic plane, to the three following stages:
   a first stage of implantation by ion bombardment of the face of said wafer by means of ions creating in the volume of said wafer at a depth close to the average penetration depth of said ions, a layer of gaseous microbubbles defining in the volume of said wafer a lower region constituting a majority of the substrate and an upper region constituting the thin film, the ions being chosen from among hydrogen gas ions or rare gas ions and the temperature of the wafer during implantation being kept below the temperature at which the gas produced by the implanted ions can escape from the semiconductor by diffusion,
   a second stage of intimately contacting the planar face of said wafer with a stiffener constituted by at least one rigid material layer,
   a third stage of thermally treating the assembly of said wafer and said stiffener at a temperature above that at which the ion bombardment takes place and adequate to create by a crystalline rearrangement effect in the wafer and a pressure effect in the microbubbles, a separation between the thin film and the majority of the substrate, the stiffener and the planar face of the wafer being kept in intimate contact during said stage.

2. Process for the preparation of thin films according to claim 1, wherein the stage of implanting ions in the semiconductor material takes place through one or more layers of materials having a nature and thickness such that they can be traversed by the ions.

3. Process for the production of thin films according to claim 1, wherein the semiconductor comprises a group IV material.

4. Process for the production of thin films according to claim 1, wherein the semiconductor is silicon, the implanted ion is a hydrogen gas ion, the wafer temperature during implantation is between 20° and 450° C. and the temperature of the third heat treatment stage exceeds 500° C.

5. Process for the production of thin films according to claim 2, wherein implantation takes place through an encapsulating thermal silicon oxide layer and the stiffener is a silicon wafer covered by at least one silicon oxide layer.

6. Process for the production of thin films according to claim 1, wherein the second stage of intimately contacting the planar face of said wafer with a stiffener takes place by applying an electrostatic pressure.

7. Process for the production of thin films according to claim 1, wherein the stiffener is deposited by one or more methods from within the group consisting of evaporation, sputtering, and chemical vapor deposition with or without plasma assistance or photon assistance.

8. Process for the production of thin films according to claim 1, wherein the stiffener is bonded to said wafer by means of an adhesive substance.

9. Process for the production of thin films according to claim 1, wherein the stiffener is made to adhere to the wafer by a treatment favoring interatomic bonds.

* * * * *